(12) United States Patent
Asai

(10) Patent No.: US 6,525,275 B1
(45) Date of Patent: Feb. 25, 2003

(54) MULTILAYER PRINTED CIRCUIT BOARDS

(75) Inventor: Motoo Asai, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 08/897,702

(22) Filed: Jul. 21, 1997

(30) Foreign Application Priority Data

Aug. 5, 1996 (JP) .............................................. 8-206170

(51) Int. Cl.[7] .................................................. H05K 1/03
(52) U.S. Cl. ........................ 174/255; 174/261; 257/738; 361/777; 361/772; 438/612
(58) Field of Search ................................. 174/254, 255, 174/260, 261, 263, 262; 361/777, 779, 795; 257/738, 778, 780; 438/612, 613, FOR 369

(56) References Cited

U.S. PATENT DOCUMENTS

| | | | |
|---|---|---|---|
| 4,866,507 A | | 9/1989 | Jacobs et al. ................ 174/258 |
| 5,248,852 A | * | 9/1993 | Kumagi ................... 174/260 X |
| 5,355,019 A | | 10/1994 | Fuchs |
| 5,433,822 A | | 7/1995 | Mimura et al. |
| 5,442,134 A | | 8/1995 | Miyazaki et al. |
| 5,473,120 A | * | 12/1995 | Ito et al. ................. 174/255 X |
| 5,487,218 A | * | 1/1996 | Bhatt et al. ............. 174/263 X |
| 5,557,844 A | | 9/1996 | Bhatt et al. |
| 5,559,372 A | | 9/1996 | Kwon ......................... 257/692 |
| 5,646,828 A | * | 7/1997 | Degani et al. .......... 257/738 X |
| 5,710,071 A | * | 1/1998 | Beddingfield et al. ...... 438/108 |
| 5,724,232 A | * | 3/1998 | Bhatt et al. ............. 174/255 X |

FOREIGN PATENT DOCUMENTS

| | | | |
|---|---|---|---|
| DE | 4327950 | | 3/1994 |
| EP | 536418 | | 4/1993 |
| EP | 559384 | | 9/1993 |
| EP | 713359 | | 5/1996 |
| JP | 402100353 | * | 4/1990 |
| JP | 3 11792 | | 1/1991 |
| JP | 4337695 | | 11/1992 |
| JP | 6 53640 | | 2/1994 |
| JP | 6 69615 | | 3/1994 |
| JP | 6204655 | | 7/1994 |
| JP | 6350230 | | 12/1994 |
| JP | 07094855 | | 4/1995 |
| WO | 9639796 | | 12/1996 |

OTHER PUBLICATIONS

English language abstract in connection with Japanese Patent No. 4–337695.

(List continued on next page.)

Primary Examiner—Albert W. Paladini
(74) Attorney, Agent, or Firm—Greenblum & Bernstein, P.L.C.

(57) ABSTRACT

Multilayer printed circuit board includes a core substrate, multilayer wiring layer formed on the core substrate by alternately laminating interlaminar insulating layer and conductor circuit, and a solder pad group having two-dimensionally arranged pads having solder bumps on a surface of the multilayer wiring layer. Solder pads of the solder pad group are arranged in only a peripheral portion other than a central portion to form a frame shape. Solder pads located at an outside part of the frame shape have flat pads having surfaces which are each connected to conductor pattern on a surface of one of the interlaminar insulating layer, and have solder bumps formed on surfaces of the flat pads. Solder pads located at an inside part of the frame shape have viaholes which are each connected to an innerlayer flat pad group located in an innerlayer, and have solder bumps in recess portions of the viaholes.

16 Claims, 7 Drawing Sheets

OTHER PUBLICATIONS

English language abstract in connection with W.I.P.O. 96/39796.

Patent Abstracts of Japan in connection with Japanese Patent No. 07–094855.

English language abstract in connection with Japanese Patent No. 6–69615.

English language abstract in connection with Japanese Patent No. 6–53640.

Patent Abstracts of Japan in connection with Japanese Patent No. 6–350230.

English language abstract in connection with Japanese Patent No. 6–204655.

English language abstract in connection with Japanese Patent No. 3–11792.

* cited by examiner

MULTILAYER PRINTED CIRCUIT BOARDS

BACKGROUND OF THE INVENTION

1. Field of the Invention

The present invention relates to a multilayer printed circuit board, and more particularly to a multilayer printed circuit board for the mounting of flip chips capable of reducing the number of wiring layers while maintaining high density packaging property on a surface of a wiring substrate.

2. Description of Related Art

In multilayer printed circuit boards for the mounting of flip chips, a group of solder pads formed by arranging many pads each provided with a solder bump is formed on a mounting surface.

In general, the solder pad group comprises pads having a structure in which sphere-shaped solder is formed on a surface of a flat and disc-shaped conductor called as a mounting pad (or land) electrically connected to a given conductor pattern of a wiring substrate through surface tension, which mounting pad is electrically connected, for example, to an external terminal for mounting a package onto a mother board or the like through given wiring drawn from the mounting pad.

In such a structure of the solder pad group, however, the solder pads located in an inner side of the solder pad group are required to electrically connect the conductor pattern connected to the mounting pad through wirings drawn from pads, which are located outside the mounting pads at a biased state, to the external terminals. Therefore, the distance between the pads located near the outer periphery of the wiring substrate is required to surely take a region corresponding to the width of the wiring and hence there is caused a problem of making the high integration of electronic components (chips) difficult.

If it is intended to attain the high integration of the electronic components (chips) in the above structure of the solder pad group, the wiring pattern is made fine and hence the frequency of failures becomes high. In the buildup wiring board forming the wiring layers on each layer, it is difficult to confirm the failure during production, so that if a failure is caused even at one place in each wiring layer, the wiring board as a final product is a failure and the good laminated material should be disposed and hence there is a problem of deterioration of production efficiency and production yield.

When multilayer printed circuit boards for mounting flip chips are particularly manufactured by the buildup method, it is necessary to attain high integration of electronic components and attain, at the same time, reduction of the wiring layer number in order to cope with mass production without reducing the production efficiency and the production yield.

SUMMARY OF THE INVENTION

It is, therefore, an object of the invention to provide a multilayer printed circuit board for mounting flip chips which can realize high integration (high densification) of solder pads and reduce the number of wiring layers while maintaining high density packaging property on a surface of a wiring substrate.

The inventor has made various studies in order to achieve the above object and as a result the invention has been accomplished.

According to the invention, there is the provision of a multilayer printed wiring board comprising a core substrate, multilayer wiring layers formed thereon by alternately laminating interlaminar insulating layers and conductor circuits and a solder pad group formed by two-dimensionally arranging pads provided with solder bumps on the surface of the multilayer wiring layer, characterized in that the solder pads of the solder pad group are arranged in only a peripheral portion other than a central portion to form a frame shape and the solder pads located at the outside part among the frame-shaped solder pad group are constructed with flat pads each connected to conductor pattern on their surface and solder bumps formed on the surfaces of the flat pads, while the solder pads located at the inside part are constructed with viaholes each connected to an innerlayer flat pad group located in an innerlayer and solder bumps formed in recess portions of these viaholes.

In the multilayer printed circuit board according to the invention, it is desirable that the solder pads located at the outside part of the solder pad group are solder pads located in at least one and up to five rows viewed from the outermost periphery, and it is desirable that the interlaminar insulating layer has a roughened surface having a surface roughness of 5–15 $\mu$m.

Furthermore, it is desirable that a solder resist layer is formed on the multilayer wiring layer and an opening size of the solder resist is larger than a diameter of each of the flat pad and the viahole so as not to overlap the solder resist with the flat pad or the viahole.

Thus, the invention proposes a new structure of the solder pad group in the multilayer printed circuit board for mounting flip chips comprising the core substrate, the multilayer wiring layer formed by alternately laminating the interlaminar insulating layers and the conductor circuits and the solder pad group formed by two-dimensionally arranging pads provided with solder bumps on the surface of the multilayer wiring layer.

Figure 2A:
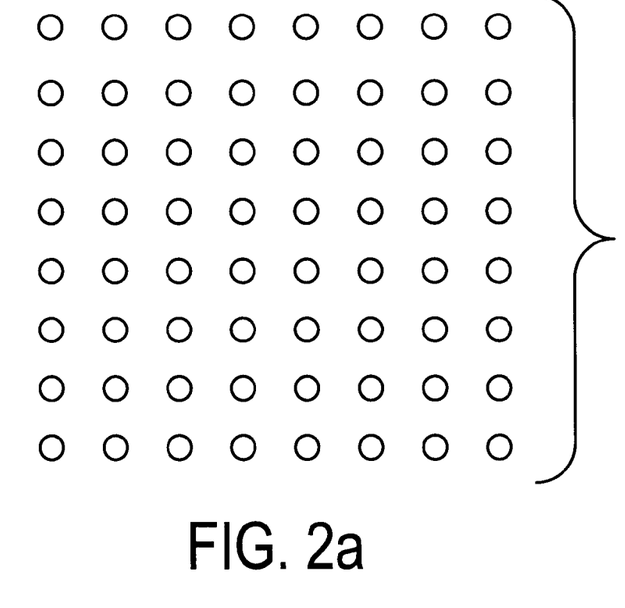
FIGS. 2(a) and (b) are schematic views illustrating solder bumps arranged in form of network and zigzag, respectively.
Figure 2B:
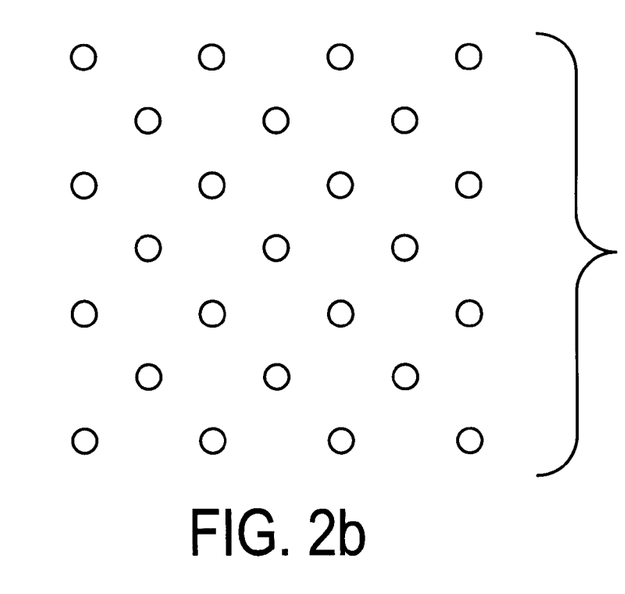

The term "two-dimensionally arrangement" used herein includes not only a method of arranging pads in form of network in X-Y directions as shown in FIG. 2(a) but also a method of arranging pads zigzag in X-Y directions as shown in FIG. 2(b). Particularly, the zigzag arrangement form is advantageous the wiring can easily be drawn out from the inside pad toward the external terminal.

Figure 1A:
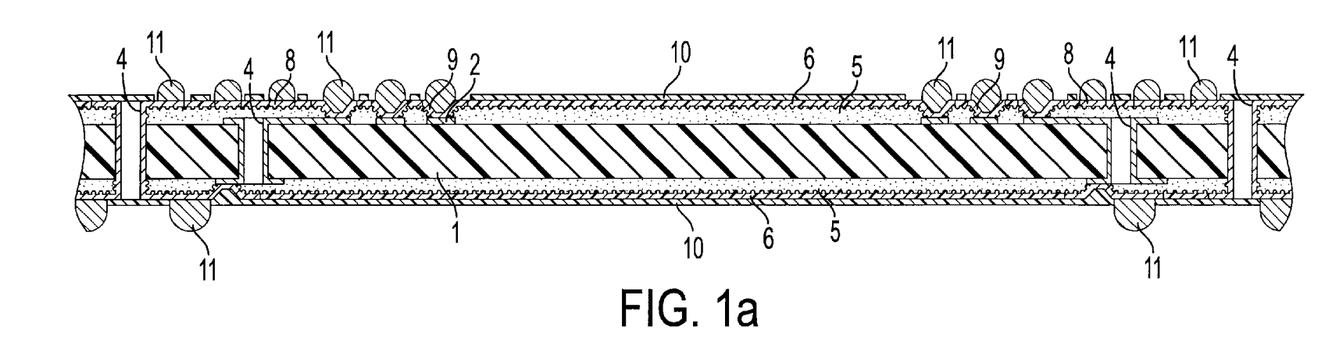
FIG. 1(a) is a diagrammatically section view of a first embodiment of the multilayer printed circuit board according to the invention.
Figure 1B:
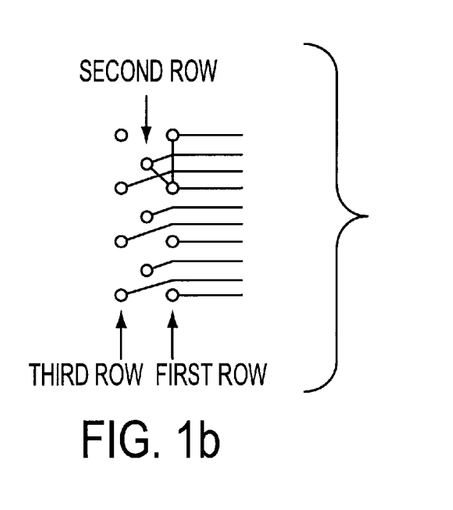
FIG. 1(b) s a schematic view illustrating a wiring state from solder pads on a surface of a wiring layer.

The invention preferably invalues a structure in which the arrangement of the solder pad group takes a zigzag form as shown in FIG. 1(b) and the solder pads located from the outermost row to a third row in the solder pad group are connected to conductor patterns on the surface of the multilayer wiring layer.

In order to draw out the wiring from the solder pad group in such a structure, it is favorable that the conductor patterns to be connected to the pads of the second and third rows are arranged so as to divide a distance between the pads of the outermost row (first row) into three equal parts and further the conductor patterns to be connected to the pads of the third row are arranged so as to divide a distance between the pad of the first row and the pad of the second row into two equal parts.

BRIEF DESCRIPTION OF THE DRAWINGS

The invention will be described with reference to the accompanying drawings, wherein.

DESCRIPTION OF THE PREFERRED EMBODIMENTS

The multilayer printed circuit board according to the invention lies in a structure in which the shape of the solder pad group formed on the surface of the multilayer wiring layer is a frame (ring) arranging the pads in only a peripheral portion other than a central portion and the solder pads located on outer portion among the frame-shaped solder pad group, desirably solder pads located from at least one outermost row and up to five outermost rows constructed with flat pads connected to conductor patterns on the surface and solder bumps formed on the flat pads, while the solder pads located in the inside portion other than the above solder pads are constituted with viaholes connected to flat innerlayer pad group located in the inner layer and solder bumps formed in recess portions of the viaholes.

In such a structure, the flat pads located from the at least one and up to five rows among the solder pads of the solder pad group (e.g. pads from first, second and third rows in FIG. 1) are connected to the conductor patterns on the surface and electrically connected to external terminals located outside of the solder pad group through wirings drawn out from these pads. At the same time, the pads other than the solder pads located from at least one and up to five rows (e.g. pads from fourth, fifth and sixth rows in FIG. 1) are connected to the flat innerlayer pad group located in the inner layer through viaholes and electrically connected to the external terminals located outside the pad group through the wirings drawn out from the innerlayer pads.

That is, the conductor patterns connected to the pads located from the at least one and up to five rows in the solder pad group are connected to the external terminals through the wirings drawn out from the pads detouring the pad of the at least one and up to five rows and the pads other than the above are viaholes connected to the innerlayer pads and also connected to the external terminals through the wirings drawn out from the innerlayer pads.

According to the invention, therefore, the structure that the wirings connected to the solder pads located in the inside of the solder pad group are divided from the innerlayer pads and drawn out therefrom is used instead of the conventional structure that all wirings for connecting to the external terminals are drawn out from the solder pad group on the surface, so that the distance between the solder pads on the surface layer can be decreased and hence the high densification (high integration) of the solder pads can be attained.

According to the invention, the shape of the solder pad group formed on the surface of the multilayer wiring layer is rendered into a frame (ring) arranging the pads in only the peripheral portion other than the central portion, whereby the reduction of the wiring layer number can be attained while maintaining the high density mounting property of the surface of the wiring substrate. The reason will be described below.

Figure 3A:
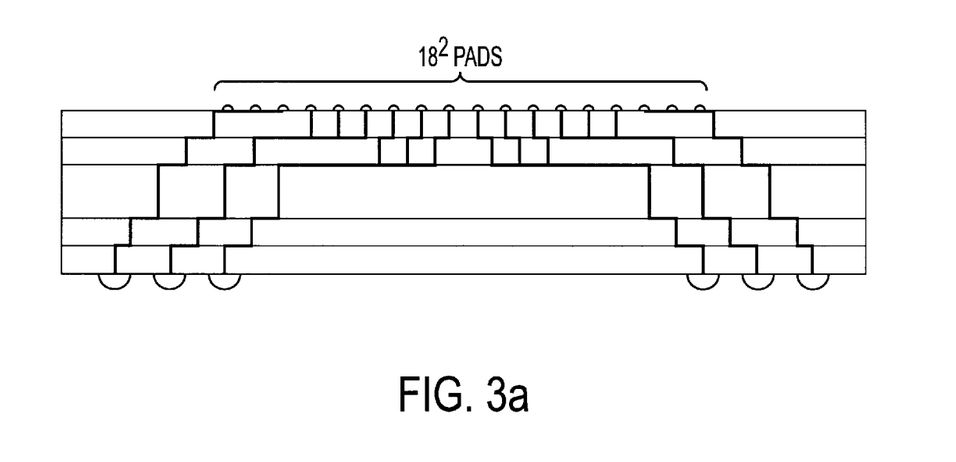
FIG. 3 shows a multilayer printed circuit board having a solder pad group arranged on a surface of a multilayer wring layer in form of full grid matrix, in which (a) is a view illustrating a connected state of innerlayer wirings and (b) is a view illustrating an arrangement of solder bumps.
Figure 3B:
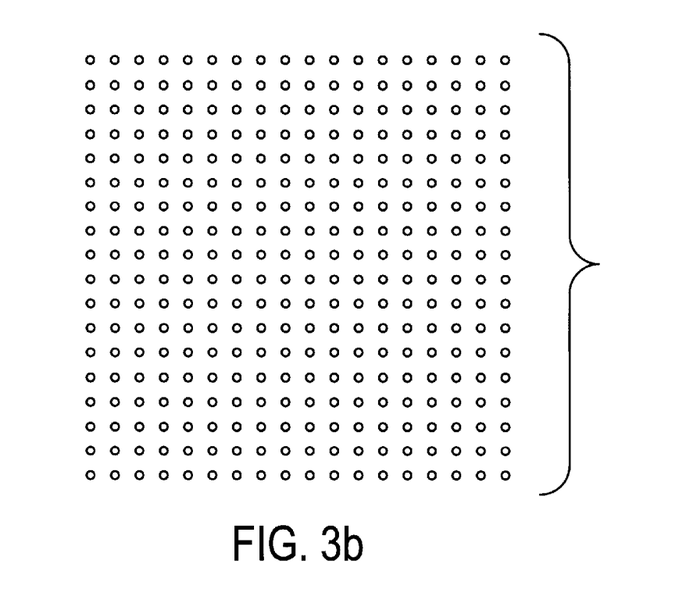
Figure 4A:
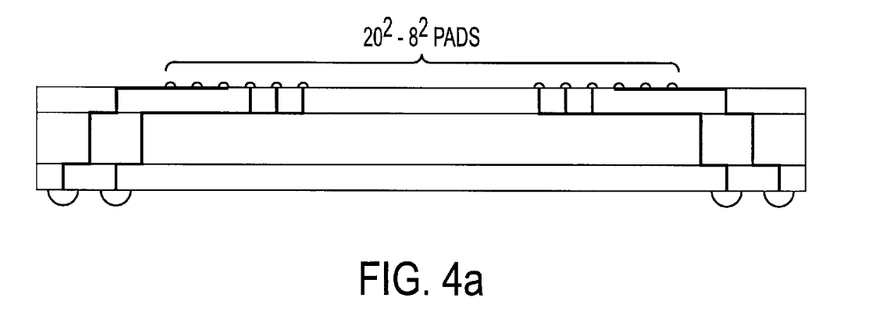
FIG. 4 shows a multilayer printed circuit board according to the invention, in which (a) is a view illustrating a connected state of innerlayer wirings and (b) is a view illustrating an arrangement of solder bumps.
Figure 4B:
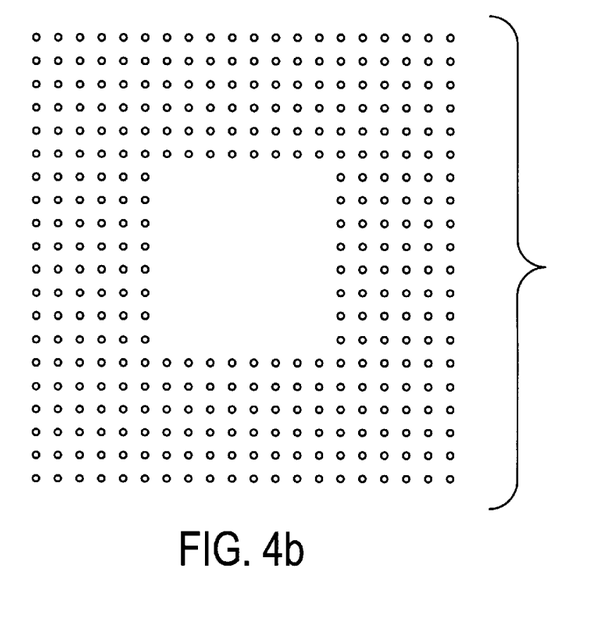

When the shape of the solder pad group is a full grid matrix as shown in FIG. 3, in order to maintain the high density packaging property on the surface of the wiring substrate, it is necessary that the solder pads located toward the central portion are sequentially divided and connected to each innerlayer pad group as an under layer through the viaholes and finally connected to the innerlayer pad group on the core substrate. In this shape, therefore, it is required to use the wiring layer for dividing into innerlayer pad groups, so that the wiring layer number can not be decreased while maintaining the high density packaging property on the surface of the wiring substrate. On the other hand, when the shape of the solder pad group is a frame form arranging the pads in only a peripheral portion other than the central portion as shown in FIG. 4, the solder pad is not present in the central portion, so that the number of the wiring layers for dividing into innerlayer pad groups can be decreased by the number corresponding to the row number in the central portion having no solder pad. In this case, in order to maintain the number of solder pads (packaging density of solder pads), it is necessary that the lacking number of solder pads located in the central portion is compensated by increasing the row number at the outside of the solder pad group. However, the increase of the row number at the outside of the solder pad group is less in the lacking row number in the central portion. In the shape of the solder pad group according to the invention, therefore, it is possible to reduce the number of the wiring layers while maintaining a high density packaging property on the surface of the wiring substrate.

For example, when the solder pad group is formed by arranging 18 solder pads on each side in a matrix form of a square full grid as shown in FIG. 3, the total number of the solder pads is 18×18=324. On the contrary, as an example of the invention, there can be exemplified a solder pad group arranged in a frame form by removing a square solder pad group of 8 pads on each side from a central portion of a solder pad group having a square form of 20 pads on each side, in which the total number of solder pads is 20×20−8×8=336. That is, according to the invention, it is possible to reduce the number of the wiring layers while maintaining the sufficient solder pad number by increasing only the two outer circumferential rows per a side as compared with 8 rows removed from the central portion. Furthermore, the row number is increased only by two rows, so that it is not difficult to arrange conductor patterns drawn out for connecting to external terminals and the like, and also the density of the solder pads is not lowered.

Figure 9:
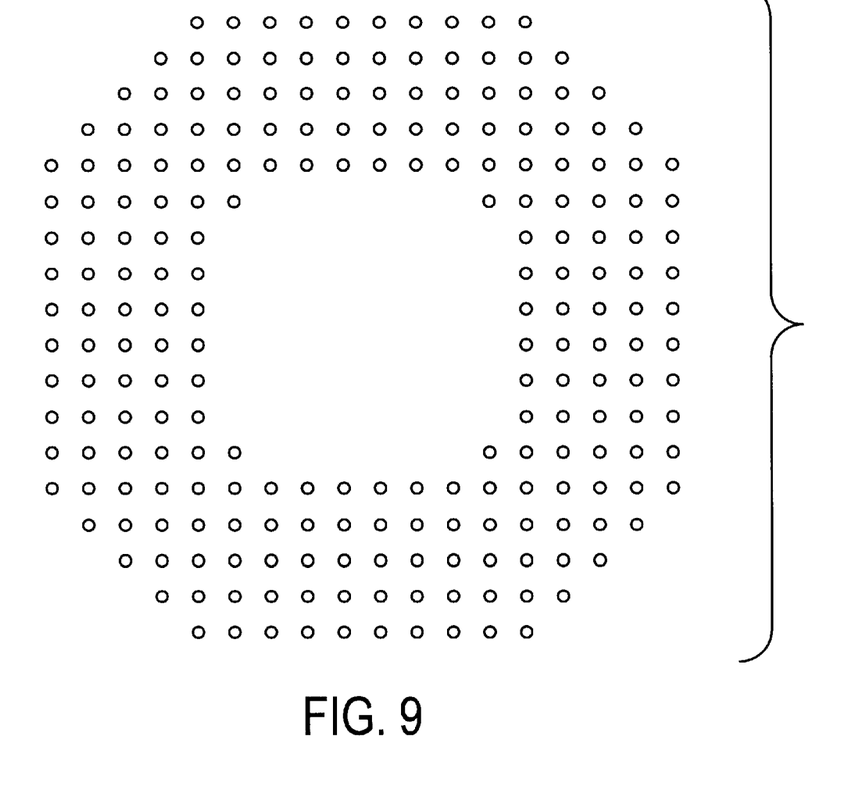
FIG. 9 is a schematic view illustrating an arrangement of solder bumps when the solder pad group arranged in a frame form has an octagonal shape.

Although the above embodiment is mentioned with respect to a case that the shape of the solder pad group arranged in the frame shape is a square shape, the shape may be rectangular, circular or polygonal such as octagonal or the like as shown in FIG. 9. Particularly, when the shape of the solder pad group is polygonal, the detouring of the conductor patterns drawn out for connecting the solder pads at corner parts to the external terminal or the like becomes less as compared with the case of rectangular or square shape. Further, pads consisting of plural viaholes for adjusting the number of solder pads can be formed in the central portion having no solder bump.

In the multilayer printed circuit board according to the invention, the solder pads located in the inside portion in the frame-shaped solder pad group, desirably solder pads other than the solder pads located inward from the at least one and up to five rows are a combination of viaholes connected to flat innerlayer pad group located in an inner layer and solder bumps formed in recess portions of the viaholes.

According to the above structure of filling solder in the recess portion of the viahole, therefore, the amount of the solder can be increased and hence the accurate mounting is made possible by self-alignment effete resulting from surface tension.

The viahole according to the invention has a structure that a metal film for electrically connecting the innerlayer pad to the conductor circuit on the surface of the interlaminar insulating layer is formed in an opening portion formed in the interlaminar insulating layer so as to expose the innerlayer pad. By filling the solder in the recess portion of the viahole, the solder pad as an embodiment of the structure according to the invention is formed. Therefore, the invention is not a technique of electrically connecting the innerlayer pad to the conductor circuit on the surface of the interlaminar insulating layer through the solder as disclosed, for example, in JP-A-4-337695. If the solder is directly contacted with the insulating resin layer as disclosed in JP-A-4-337695, the degradation of the resin is caused by the diffusion of lead. And also, the wettability between resin and solder is poor,, so that the viahole made from the solder is apt to be fallen down. In this point, according to the invention, the viahole is made from the metal film and the solder is filled in the recess portion of the viahole, so that there is caused no degradation of the resin nor falling down of the viahole.

Moreover, the conductor patterns of the multilayer wiring layer connected to the above pad group are connected to external terminals arranged on the rear surface of the core substrate such as solder bumps, conductor pins and the like through the through-holes formed in the core substrate. Particularly, it is favorable that the multilayer wiring layer formed by alternately laminating the conductor layers and the insulating resin layers for electrically connecting to the through-holes is formed in the rear surface of the core substrate and the solder bumps are formed on the surface thereof (see FIG. 1).

In the multilayer printed circuit board according to the invention, the viaholes constituting the solder pad group are apt to be peeled off because they are connected only to the innerlayer pads. In order to prevent the peeling of the viaholes, therefore, it is desirable that a roughened surface having a surface roughness of 5–15 $\mu$m is formed on the interlaminar insulating layer. When the surface roughness is less than 5 $\mu$m, the adhesion strength to the viahole is insufficient, while when it exceeds 15 $\mu$m, it is difficult to obtain fine conductor patterns.

In the invention, the solder resist layer is formed on the surface of the multilayer wiring layer. In this case, it is advantageous that the opening size of the solder resist is made larger than the diameter of the flat pad constituting the solder pad or the viahole so as not to overlap the solder resist with the pad or viahole, whereby the pad and viahole are completely exposed from the openings of the solder resists.

In the structure of the higher integrated solder pads as in the invention, when the opening size of the solder resist is made smaller than the diameter of the pad, if the opening is formed by subjecting the solder resist of the photosensitive resin to a light exposure development (so-called photolithography), the position shifting of the opening portion is caused by temperature expansion and shrinkage of the photomask and hence the exposure area of the pad is substantially decreased. As a result, when the solder is formed on the opening portion, problems such as flowing of solder, solder bridge and the like are apt to be created and the mounting reliability of the component becomes poor.

Figure 5A:
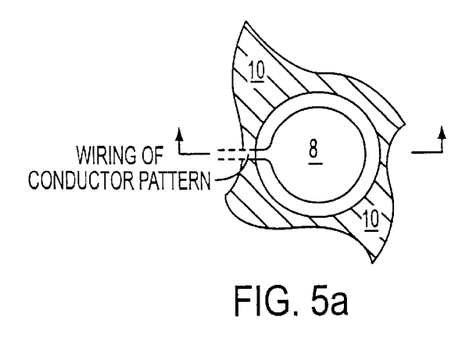
FIGS. 5(a) and 5(c) are views illustrating an opening state of a solder resist on a flat pad.
Figure 5B:
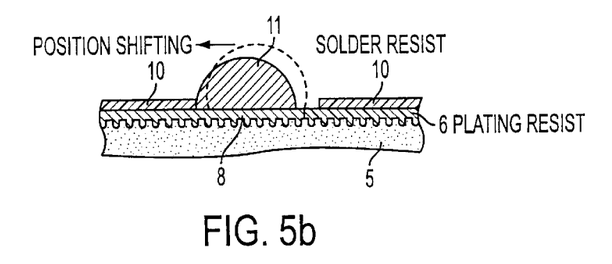
FIG. 5(b) is a view illustrating an occurrence of position displacement of a solder bump in the flat pad.
Figure 5C:
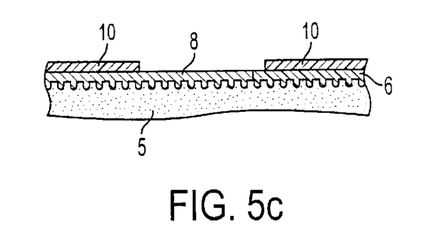

On the other hand, in the conventional technique of constituting all solder pads located on the surface of the multilayer wiring layer with flat pads, all of the flat pads are connected to the conductor patterns in the same layer having the pads. Therefore, when the opening size of the solder resist is made larger than the diameter of the pad, a part of the wiring in the conductor pattern is apt to be at an exposed state (see FIGS. 5(a) and 5(c). As a result, if the solder is formed on the solder resist, it is placed on the exposed wiring of the conductor pattern to lower the solder bump and also the position shifting of the solder bump is caused (see FIG. 5(b)).

Figure 6A:
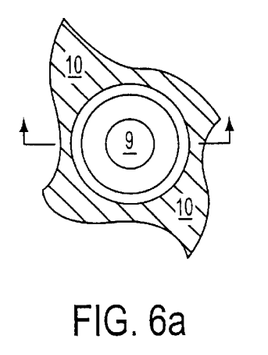
FIGS. 6(a) and 6(c) are view illustrating an opening state of a solder resist in a viahole.
Figure 6B:
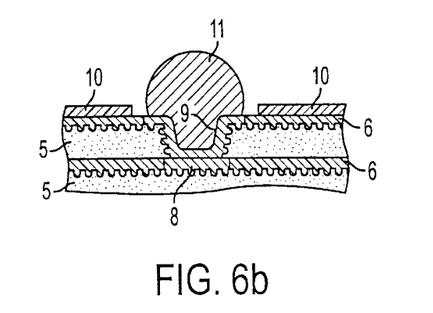
FIG. 6(b) is view illustrating no occurrence of position displacement of solder bump in the viahole.
Figure 6C:
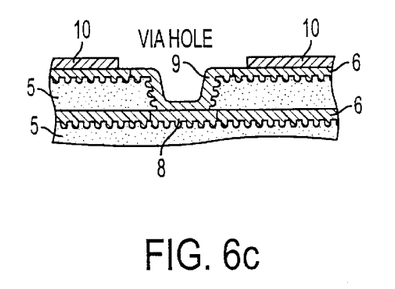

According to the invention, the solder pad group other than the solder pads located at the outside of the frame-shaped solder pad group are constituted with solder bumps formed in the recess portions of the viaholes, so that they are never connected to the conductor patterns located in the same layer. Further, in the invention, the pads for the formation of solder bumps are not newly wired from the viaholes, so that even when the opening size of the solder resist is made larger than the diameter of the viahole, the wiring of the conductor pattern is not exposed from the opening portion of the solder resist (see FIGS. 6(a) and 6(c). Therefore, when the solder bump is formed in the recess portion of the viahole according to the invention, the lowering of the solder bump is not caused and also the position shifting of the solder bump is not caused (see FIG. 6(b)).

Figure 7:
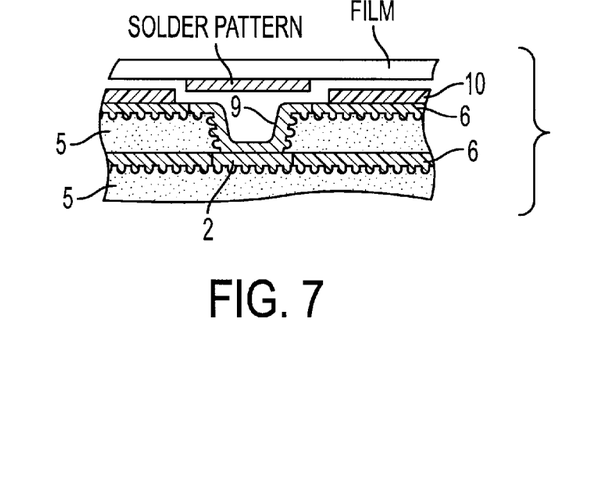
FIG. 7 is a view illustrating fitness of solder pattern into an opening of a solder resist in solder transferring method.

The structure that the opening size of the solder resist is made larger than the diameter of the pad is particularly advantageous when the solder bump is ,d formed by solder transferring method. The solder transferring method is carried out by etching a solder foil attached onto a film to form patterns of solder foil at places corresponding to positions of pads, placing the patterned solder foil so as to contact with the pads and reflowing under heating to transfer the solder onto the pads because the solder is not drapable with the film but is drapable with metal. In such a solder transferring method, an area of solder foil pattern formed on the film is generally larger than the pad. Therefore, when the opening size of the solder resist is made larger than the diameter of the pad, the solder pattern is just fitted into the opening portion of the solder resist to easily conduct the positioning thereof (see FIG. 7).

In the multilayer printed circuit board according to the invention, the wiring layer located as an outermost layer is formed by flat pads and viaholes between plating resists through the plating resist and a solder resist layer having opening portions for exposing the flat pads and viaholes is formed on the surface thereof. It is advantageous that the opening size of the solder resist layer is made larger than the diameter of the pad or the viahole to expose a part of the pads, viaholes and the plating resist.

Figure 8A:
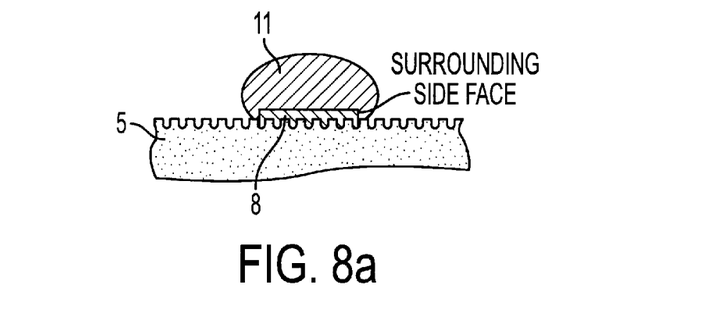
FIGS. 8(a) and (b) a e views illustrating formation of solder bump in the presence or absence of solder resist, respectively.
Figure 8B:
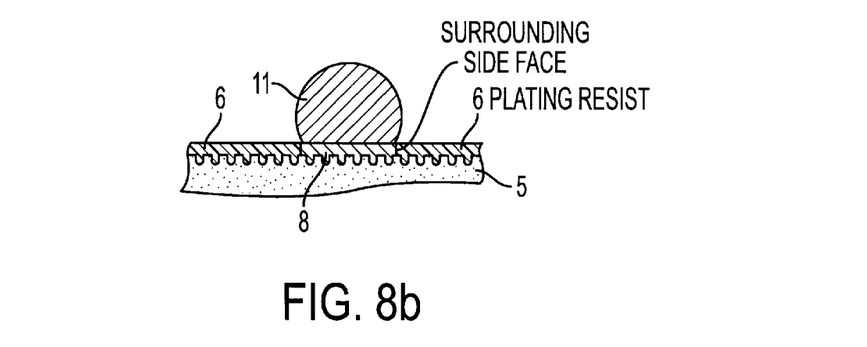

By such a structure, a surrounding side face of the pad or the viahole is covered with the plating resist (see FIG. 8). Therefore, the solder is not adhered to the surrounding side face. As a result, the solder bump is not lowered and the connection reliability is excellent.

The production of the multilayer printed circuit board according to the invention will be described below.

Moreover, in heat cycle, cracks may be generated in the interlaminar insulating resin layer (the adhesive layer for electroless plating) starting from a boundary between the plating resist and the conductor pattern.

Figure 10:
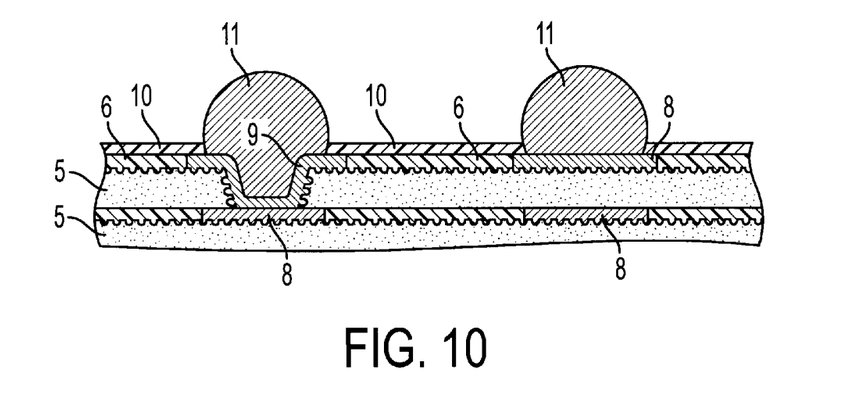
FIG. 10 is a schematic view illustrating an opening size of a solder resist layer that is smaller than a diameter of a flat pad or viahole.

In order to prevent the occurrence of cracks, it is desirable that the opening size of the solder resist layer is made smaller than the diameter of the flat pad or the viahole so as to overlap the solder resist with the pad or the viahole as shown in FIG. 10.

Furthermore, when the multilayer printed circuit board is manufactured by the semi-additive process, a plating resist is not present in the multilayer printed circuit board, so that the peeling of the solder is apt to be caused. In this case, when the opening size of the solder resist is made smaller than the diameter of the flat pad or the viahole, the peeling of the solder pad can be prevented.

(1) An innerlayer copper pattern 2 and innerlayer pad are first formed on a surface of a substrate (core material).

The formation of the copper pattern 2 on the substrate 1 is carried out by etching a copper clad laminate, or by a method wherein an adhesive layer for electroless plating is formed on a substrate such as glass epoxy substrate, polyimide substrate, ceramic substrate, metal substrate or the like and a surface of the adhesive layer is roughened to form a roughened surface and then subjected to an electroless plating.

Particularly, when the copper pattern 2 is formed by etching the copper clad laminate, it is desirable that a solvent-free insulating resin (epoxy resin or polyimide resin) is applied and cured and polished to expose the copper pattern 2 and smoothen the surface of the substrate. The smoothening of the substrate surface facilitates the light exposure and development because a thickness of a photosensitive insulating resin layer to be formed on the substrate surface is made uniform.

Moreover, through-holes 4 are formed in the core substrate 1 shown in FIG. 1, and front and back wiring layers are electrically connected to each other through the through-holes 4.

(2) Then, an interlaminar insulating layer 5 is formed on the innerlayer copper pattern 2 and innerlayer pads formed in the item (1). The interlaminar insulating layer 5 is desirable to be made from a thermosetting resin such as epoxy resin, polyimide resin, bismaleimide triazine resin, phenolic resin or the like; a photosensitive resin obtained by photosensitizing the thermosetting resin; a thermoplastic resin such as polyether sulphone or the like; a composite of the thermoplastic resin and the thermosetting resin; or a composite of the thermoplastic resin and the photosensitive resin.

The surface of the resin layer may be subjected to a roughening treatment with an oxidizing agent, an acid, an alkali or the like. The adhesion property between the surface and a conductor circuit formed thereon can be improved by such a roughening.

As the interlaminar insulating material, it is particularly desirable to use an adhesive for electroless plating. The adhesive for electroless plating is optimum to be formed by dispersing heat-resistant resin particles soluble in acid or oxidizing agent into a heat-resistant resin hardly soluble in acid or oxidizing agent. This is due to the fact that octopus trap-shaped anchors can be formed on the surface by removing the heat-resistant resin particles soluble in acid or oxidizing agent through roughening to considerably improve the adhesion property to the conductor circuit.

As the heat-resistant resin hardly soluble in acid or oxidizing agent in the adhesive, it is desirable to use a photosensitized thermosetting resin or a composite of photosensitized thermosetting resin and thermoplastic resin because viaholes can easily be formed by light exposure and development after the photosensitization. Furthermore, the toughness can be improved by the composite with the thermoplastic resin, whereby the peel strength of the conductor circuit can be improved and the occurrence of cracks in the viahole portion through heat cycle can be prevented.

More specifically, the use of epoxy acrylate obtained by reacting epoxy resin with acrylic acid or methacrylic acid, or a composite of epoxy acrylate and polyether sulphone is favorable. As the epoxy acrylate, it is desirable that 20–80% of all epoxy group is reacted with acrylic acid or methacrylic acid.

In the adhesive, the heat-resistant resin particles are preferably selected from ① heat-resistant resin powder having an average particle size of not more than 10 μm, ② aggregate particles having an average particle size of 2–10 μm by aggregating heat-resistant resin powder having an average particle size of not more than 2 μm, ③ a mixture of heat-resistant resin powder having an average particle size of 2–10 μm and heat-resistant resin powder having an average particle size of not more than 2 μm and ④ false particles obtained by adhering at least one of heat-resistant resin powder having an average particle size of not more than 2 μm and inorganic powder having an average particle size of not more than 2 μm to surfaces of heat-resistant resin powder having an average particle size of 2–10 μm because these particles can form complicated anchors. As the resin in the heat-resistant resin particles, epoxy resin, amino resin (melamine resin, urea resin, guanamine resin) and the like are favorable. Particularly, the epoxy resin can optionally change the solubility to acid or oxidizing agent by varying a kind of oligomer, a kind of a curing agent and a crosslinking density. For example, a cured product obtained by treating bisphenol A-type epoxy resin oligomer with an amine curing agent is easily dissolved in an oxidizing agent, while a cured product obtained by treating novolac epoxy resin oligomer with an imidazole curing agent is hardly dissolved in an oxidizing agent.

As the acid used in the invention, mention may be made of phosphoric acid, hydrochloric acid, sulfuric acid and organic acid such as formic acid, acetic acid or the like. Particularly, the use of the organic acid is desirable because a metal conductor layer exposed from the viahole is hardly corroded after the roughening with the organic acid. As the oxidizing agent, chromic acid, permanganate (potassium permanganate or the like) are desirable. Particularly, in case of removing the amino resin through dissolution, it is desirable to alternately conduct the roughening treatment with acid and oxidizing agent.

In the multilayer printed circuit board according to the invention, the interlaminar insulating layer 5 may have plural layers. For example, the following forms may be taken as the plural layers.

①. The interlaminar insulating layer formed between upperlayer conductor circuit and underlayer conductor circuit is an interlaminar insulating layer of two-layer structure in which a layer close to the upperlayer conductor circuit is an adhesive for electroless plating obtained by dispersing heat-resistant resin particles soluble in acid or oxidizing agent into heat-resistant resin hardly soluble in acid or oxidizing agent and a layer close to the underlayer conductor circuit is a heat-resistant resin hardly soluble in acid or oxidizing agent.

In this structure, if the adhesive layer for electroless plating is too roughened by the roughening treatment, there is caused no shortcircuit between the layers.

②. The interlaminar insulating layer formed between upperlayer conductor circuit and underlayer conductor circuit is an interlaminar insulating layer of three-layer structure in which a filling resin material is embedded between the underlayer conductor circuits so as to be in the same plane between the underlayer conductor circuit and the filling resin, and a heat-resistant resin layer hardly soluble in acid or oxidizing agent is formed thereon, and further an adhesive for electroless plating obtained by dispersing heat-resistant resin particles soluble in acid or oxidizing agent into heat-resistant resin hardly soluble in acid or oxidizing agent is formed thereon.

In this structure, the filling resin material is filled between the underlayer conductor circuits, so that the surface of the substrate becomes smooth and poor development due to changes in thickness is avoided. Furthermore,; shrinkage form curing can be reduced to prevent warping of the substrate by including inorganic particles such as silica or the like into the filling resin material. Moreover, solvent-free resin is desirable as the filling resin material, and particularly solvent-free epoxy resin is optimum. If a solvent is used, the remaining solvent is vaporized by heating to cause interlaminar peeling.

(3) After the interlaminar insulating layer 5 formed in the item (2) is dried, an opening portion for viahole is formed by light exposure and development in the case of photosensitive resin or by thermosetting and laser work in the case of thermosetting resin.

(4) After the surface of the interlaminar insulating layer 5 provided with the opening portion for viahole in the item (3) is roughened, a catalyst nucleus is applied.

As the catalyst nucleus, noble metal, colloid and the like are desirable, and generally palladium chloride and palladium colloid are used. Moreover, it is desirable to conduct a heating treatment for fixing the catalyst nucleus.

(5) After the application of the catalyst nucleus in the item (4), a plating resist 6 is formed.

As the plating resist 6, commercially available product may be used, and also there may be used a composition of an imidazole curing agent and epoxy acrylate obtained by reacting epoxy resin with acrylic acid or methacrylic acid, or a composition of epoxy acrylate, polyether sulphone and an imidazole curing agent.

A ratio of epoxy acrylate to polyether sulphone is desirable to be about 50/50–80/20. If the amount of epoxy acrylate is too large, the flexibility lowers, while when it is too small, the photosensitivity, resistance to base, resistance to acid, resistance to oxidizing agent and the like lower.

The epoxy acrylate is preferably a reaction product in which 20–80% of all epoxy groups are reacted with acrylic acid or methacrylic acid. If the acrylation is too high, hydrophilicity with OH group is too high and the hygroscopicity rises, while if it is too low, the resolution lowers.

As the epoxy resin being a basic skeleton resin, novolac type epoxy resin is desirable, because it is high in the crosslinking density and can adjust the water absorption of the cured product to not more than 0.1% and is excellent in the resistance to base. As the novolac type epoxy resin, there are cresol novolac type epoxy resin and phenol novolac type epoxy resin.

(6) A portion not forming the plating resist 6 in the item (5) is subjected to a primary plating. In this case, flat pads 8 and viaholes 9 arranged in the frame form are formed in addition to the copper pattern.

In view of the above and in view of the drawings, the solder pads 11 located at an outside part of the frame shape have flat pads 8 connected to conductor pattern, wherein the flat pads 8 and conductor pattern are on a same surface of the interlaminar insulating layer 5.

As a primary plating, it is desirable to be an alloy plating using at least two metal ions selected from copper, nickel, cobalt and phosphorus because these alloys are high in the strength and can improve the peel strength.

In the electroless plating solution for primary plating, it is desirable to use hydroxy carboxylic acid as a complexing agent forming a stable complex compound with copper, nickel, and cobalt ions under basic condition. In the electroless plating solution for the primary plating, a reducing agent for reducing the metal ion into metallic element is desirable to be at least one selected from aldehyde, hypophosphate (called as phosphinate), hydride borate and hydrazine. These reducing agents are soluble in water and excellent in the reducing power. Particularly, hypophosphate is desirable for precipitating nickel.

In the electroless plating solution for primary plating, it is desirable to use at least one basic compound selected from sodium hydroxide, potassium hydroxide and calcium hydroxide as a pH adjusting agent for adjusting to basic condition. Under the basic condition, hydroxy carboxylic acid forms a complex with nickel ion. As the hydroxy carboxylic acid, citric acid, malic acid and tartaric acid are desirable. They easily form a complex with nickel, cobalt or copper. The concentration of the hydroxy carboxylic acid is preferably 0.1–0.8M. When the concentration is less than 0.1M, the complex can not sufficiently be formed and abnormal precipitation and decomposition of the solution are caused. While, when it exceeds 0.8M, the precipitation rate becomes slow and the generation of hydrogen undesirably becomes frequent.

The electroless plating solution for the primary plating is preferably contains bipyridyl. Because, bipyridyl can control the occurrence of metal oxide in the plating bath to suppress the occurrence of nodule.

Moreover, copper ion, nickel ion and cobalt ion are supplied by dissolving copper, nickel and cobalt compounds such as copper sulfate, nickel sulfate, cobalt sulfate, copper chloride, nickel chloride, cobalt chloride and the like.

The primary plated film made from such an electroless plating solution is excellent in the followability to the roughened surface of the adhesive layer for electroless plating or traces the form of the roughened surface. Therefore, the primary plated film has the same anchor as in the roughened surface. As a result, a secondary plated film formed on the primary plated film ensure the adhesion property owing to such an anchor. Accordingly, the primary plated film is preferably a high-strength plated film precipitated from the electroless plating solution in order to control the peel strength, while the secondary plated film is preferably high in the electric conductivity and fast in the precipitation rate and hence to be a plated film precipitated from a simple copper plating solution instead of a composite plating solution.

(7) The primary plated film formed in the item (6) is subjected to a secondary plating to form conductor circuits including the flat pads 8 and viaholes 9. The plated film through the secondary plating is preferably a copper plated film.

The electroless plating solution for the secondary plating is preferably an electroless plating solution comprising copper ion, trialkanol amine, a reducing agent and a pH adjusting agent in which the concentration of copper ion is 0.005–0.015 mol/l, the concentration of the pH adjusting agent is 0.25–0.35 mol/l and the concentration of the reducing agent is 0.01–0.04 mol/l. Such a plating solution is stable in the plating bath and reduces the occurrence of nodule and the like.

In the electroless plating solution for the secondary plating, the concentration of trialkanol amine is preferably 0.1–0.8M. The plating precipitation rate is most promoted within such a range. The trialkanol amine is preferably at least one selected from triethanol amine, triisopanol amine, trimethanol amine and tripropanol amine because they are soluble in water.

In the electroless plating solution for secondary plating, the reducing agent is preferably at least one selected from aldehyde, hypophosphate, hydride borate and hydrazine. They are soluble in water and excellent in reducing power. The pH adjusting agent preferably at least one basic compound selected from sodium hydroxide, potassium hydroxide and calcium hydroxide.

Thus, there are formed viaholes 9 each having of the primary plated film and the secondary plated film for electrically connecting the conductor pattern and the flat pads 8 arranged in the frame shape and the upperlayer conductor to the innerlayer pads.

The viaholes are 14×14−8×8=132 in the embodiment of FIG. 1 and are formed on an upper surface of the flat innerlayer pad group of frame-arranged 132 pads for electrically connecting to the conductor patterns in the core substrate. Further, 204 flat pads are formed in frame shape on the surface layer of the wiring substrate at the outside of the viahole.

Moreover, the solder pad group formed on the surface layer of the wiring substrate is preferably connected to the conductor patterns in zigzag form as shown in FIG. 1(*b*). That is, as shown in FIG. 1(*b*), the conductor patterns drawn from the pads of the second and third rows are arranged so as to divide the outermost peripheral pads into three equal parts and further the conductor patterns drawn from the pads of the third row are arranged so as to divide the pads of the first row and the pads of the second row into two equal parts.

(8) Then, a photosensitive solder resist 10 is applied, exposed to light and developed to form a layer of solder resist 10 having an opening size larger than that of flat pad 8 or viahole 9 at positions of the flat pads 8 and the viaholes 9. More specifically, the diameter of the flat pad 8 is 100 μm, the diameter of the viahole, 9 is 175 μm, the opening size of the solder resist 10 for flat pad 8 is 125 μm, and the opening size of the solder resist 10 for viahole 9 is 200 μm.

(9) The surfaces of the flat pads 8 and viaholes 9 exposed from the opening of the solder resist 10 in the item (7) are subjected to Ni plating and Au plating in this order.

(10) Then, a solder foil is laminated onto a polyethylene terephthalate film and subjected to an etching treatment so as to leave solder patterns on positions corresponding to the viaholes and the pads. Next, this film is laminated so as to contact the solder patterns with the pads and viaholes and the solder is transferred to the pads and viaholes by reflowing under heating to form solder bumps 11. Moreover, a ratio of solder amount in the pad to solder amount in the viahole is, for example, 190:210.

The thus obtained multilayer printed circuit board is diagrammatically shown in FIG. 1. This multilayer printed circuit board also has multilayer wiring layers at the back side, which are fundamentally produced in the same manner as described above.

In the invention, a semi-additive process may be adopted in addition to the full additive process as the method of producing the multilayer printed circuit board.

The semi-additive process is a method wherein a surface of an interlaminar insulating resin layer is roughened and subjected to an electroless plating of a thin thickness over a full surface and a plating resist is formed on a portion of the electroless plated film not forming conductor and a portion not forming the resist is subjected to an electrolytic plating of a thick thickness and then the plating resist and the electroless plated film located therebelow are removed to form a conductor circuit pattern.

As mentioned above, according to the invention, there can be provided multilayer printed circuit boards for the mounting of flip chips capable of attaining the high integration (high densification) of solder pads and reducing the number of wiring layers while maintaining a high density mounting property of wiring substrate surface. Thus, it is possible to improve the yield of the multilayer printed circuit board and reduce the production cost.

What is claimed is:

1. A multilayer printed circuit board, comprising:
   a core substrate;
   multilayer wiring layer formed on the core substrate by alternately laminating at least one interlaminar insulating layer and conductor pattern; and
   a solder pad group comprising two-dimensionally arranged pads having solder bumps on a surface of the multilayer wiring layer;
   wherein the two-dimensionally arranged pads of the solder pad group are arranged in only a peripheral portion other than a central portion to form a frame shape;
   wherein solder pads located at an outside part of the frame shape have flat pads connected to the conductor pattern, the flat pads and conductor pattern being on a same surface of one of the at least one interlaminar insulating layer, and wherein the solder bumps of the solder pads located at the outside part of the frame shape are formed on surfaces of the flat pads, the solder pads located at the outside part of the frame shape being located in at least two and up to five rows from an outermost periphery of the frame shape; and
   wherein solder pads located at an inside part of the frame shape have viaholes which are each connected to an innerlayer flat pad group located in an innerlayer, and wherein the solder bumps of solder pads located at the inside part for the frame shape are in recess portions of the viaholes.

2. The multilayer printed circuit board of claim 1, wherein the interlaminar insulating layer comprises a roughened surface having a surface roughness of 5 to 15 μm.

3. The multilayer printed circuit board of claim 2, wherein the solder pads located at an inside part of the frame shape comprise a plurality of rows of solder pads connected to an innerlayer pad group through viaholes.

4. The multilayer printed circuit board of claim 2, wherein the solder pads located at an inside part of the frame shape comprise a first plurality of rows of solder pads connected to a first innerlayer pad group through a first set of viaholes, and a second plurality of rows of solder pads connected to a second innerlayer pad group through a second set of viaholes.

5. The multilayer printed circuit board of claim 2, wherein the solder pads are arranged zigzag in an X-Y direction on the surface of the multilayer wiring layer.

6. The multilayer printed circuit board of claim 1, further comprising a solder resist layer on the multilayer wiring layer, and wherein an opening of the solder resist is larger than a diameter of a corresponding one of We flat pads and the viaholes of the solder pads so as to not overlap the solder resist on the corresponding one of flat pads and the viaholes.

7. The multilayer printed circuit board of claim 6, wherein the solder pads located at an inside part of the frame shape comprise a plurality of rows of solder pads connected to an innerlayer pad group through viaholes.

8. The multilayer printed circuit board of claim 6, wherein the solder pads located at an inside part of the frame shape comprise a first plurality of rows of solder pads connected to a first innerlayer pad group through a first set of viaholes, and a second plurality of rows of solder pads connected to a second innerlayer pad group through a second set of viaholes.

9. The multilayer printed circuit board of claim 6, wherein the solder pads are arranged zigzag in an X-Y direction on the surface of the multilayer wiring layer.

10. The multilayer printed circuit board of claim 1, further comprising a solder resist layer on the multilayer wiring layer, and wherein an opening of the solder resist is smaller than a diameter of a corresponding one of a flat pads and the viaholes of the solder pads so as to overlap the solder resist on the corresponding one of the flat pads and the viaholes.

11. The multilayer printed circuit board of claim 10, wherein the solder pads located at an inside part of the frame shape comprise a plurality of rows of solder pads connected to an innerlayer pad group through viaholes.

12. The multilayer printed circuit board of claim 10, wherein the solder pads located at an inside part of the frame shape comprise a first plurality of rows of solder pads connected to a first innerlayer pad group through a first set of viaholes, and a second plurality of rows of solder pads connected to a second innerlayer pad group through a second set of viaholes.

13. The multilayer printed circuit board of claim 10, wherein the solder pads are arranged zigzag in an X-Y direction on the surface of the multilayer wiring layer.

14. The multilayer printed circuit board of claim 1, wherein the solder pads located at an inside part of the frame shape comprise a plurality of rows of solder pads connected to an innerlayer pad group through viaholes.

15. The multilayer printed circuit board of claim 1, wherein the solder pads located at an inside part of the frame shape comprise a first plurality of rows of solder pads connected to a first innerlayer pad group through a first set of viaholes, and a second plurality of rows of solder pads connected to a second innerlayer pad group through a second set of viaholes.

16. The multilayer printed circuit board of claim 1, wherein the solder pads are arranged zigzag in an X-Y direction on the surface of the multilayer wiring layer.

* * * * *

UNITED STATES PATENT AND TRADEMARK OFFICE
CERTIFICATE OF CORRECTION

PATENT NO.     : 6,525,275 B1
DATED          : February 25, 2003
INVENTOR(S)    : M. Asai It is certified that error appears in the above-identified patent and that said Letters Patent is hereby corrected as shown below:

<u>Column 13,</u>
Line 12, "We" should be -- the --.
Line 14, before "flat pads" insert -- the --.
Line 32, "a" should be -- the --.

Signed and Sealed this

Sixteenth Day of December, 2003

JAMES E. ROGAN
*Director of the United States Patent and Trademark Office*